US012408564B2

(12) United States Patent
Ando et al.

(10) Patent No.: US 12,408,564 B2
(45) Date of Patent: Sep. 2, 2025

(54) PROCESS-INDUCED FORMING OF OXIDE RRAM

(71) Applicant: INTERNATIONAL BUSINESS MACHINES CORPORATION, Armonk, NY (US)

(72) Inventors: Takashi Ando, Eastchester, NY (US); Soon-Cheon Seo, Glenmont, NY (US); Youngseok Kim, Upper Saddle River, NJ (US); Hiroyuki Miyazoe, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 461 days.

(21) Appl. No.: 18/052,590

(22) Filed: Nov. 4, 2022

(65) Prior Publication Data

US 2024/0155952 A1    May 9, 2024

(51) Int. Cl.
*H10N 70/20* (2023.01)
*H10N 70/00* (2023.01)

(52) U.S. Cl.
CPC .......... *H10N 70/023* (2023.02); *H10N 70/24* (2023.02); *H10N 70/826* (2023.02); *H10N 70/841* (2023.02); *H10N 70/8833* (2023.02)

(58) Field of Classification Search
CPC ........................... H10N 70/826; H10N 70/011
See application file for complete search history.

(56) References Cited

U.S. PATENT DOCUMENTS

| 9,362,497 | B2 | 6/2016 | Kumar |
| 9,431,609 | B2 | 8/2016 | Dang |
| 10,340,451 | B2 | 7/2019 | Tada |
| 10,756,266 | B2 | 8/2020 | Wang |
| 11,017,852 | B2 * | 5/2021 | Tu ........................ H10N 70/826 |
| 11,223,008 | B2 * | 1/2022 | Rizzolo .................. H10N 50/85 |
| 11,844,290 | B2 | 12/2023 | Koty et al. |
| 2021/0234096 | A1 | 7/2021 | Consiglio |
| 2021/0336135 | A1 | 10/2021 | Jiang |

OTHER PUBLICATIONS

Radamson et al., "Miniaturization of CMOS", Micromachines 2019, 10, 293, pp. 1-52.

(Continued)

*Primary Examiner* — Mark V Prenty
(74) *Attorney, Agent, or Firm* — Yuanmin Cai

(57) ABSTRACT

Embodiments of present invention provide a method of forming a resistive random-access memory (RRAM). The method includes forming a dielectric layer on top of a supporting structure, wherein the dielectric layer has a bottom electrode embedded therein; forming an oxide layer on top of the bottom electrode; treating the oxide layer in a plasma environment; forming a top electrode on top of the oxide layer; forming a first interlevel-dielectric (ILD) layer on top of the top electrode; forming a via contact and a first metal layer in the first ILD layer, wherein the first metal layer is in contact with the top electrode through the via contact; forming a capping layer on top of the first metal layer through a plasma-enhanced deposition process; and causing formation of one or more filaments in the oxide layer during the plasma-enhanced deposition process. A structure of the RRAM is also provided.

8 Claims, 12 Drawing Sheets

(56) References Cited

OTHER PUBLICATIONS

Su et al., "A Method to Reduce Forming Voltage Without Degrading Device Performance in Hafnium Oxide-Based 1T1R Resistive Random Access Memory", Journal of the Electron Devices Society, vol. 6, Date of publication Feb. 23, 2018, 341-345.
Waser, "EMRL Electronic Materials Research Laboratory", http://www.emrl.de/r_a_1.htm, Accessed on Aug. 24, 2022, 10 pages.
Wong et al., "Metal-Oxide RRAM", Invited Paper, Proceedings of the IEEE, vol. 100, No. 6, Jun. 2012, pp. 1951-1970.
Wu et al., "Fundamental limitations of existing models and future solutions for dielectric reliability and RRAM applications (Invited)", © 2017 IEEE, IEDM17, pp. 21.5.1-21.5.4.

* cited by examiner

PROCESS-INDUCED FORMING OF OXIDE RRAM

BACKGROUND

The present application relates to manufacturing of semiconductor integrated circuits. More particularly, it relates to an oxide resistive random-access memory device and the electroforming of the device.

Resistive random-access memory (RRAM) or RRAM device is widely considered as a promising technology for use as electronic synapse devices or memristors in neuromorphic computing as well as high-density and high-speed non-volatile memory applications. In neuromorphic computing applications, a RRAM device may be used as a connection (synapse) between a pre-neuron and a post-neuron, representing the connection weight in the form of device conductance. Multiple pre-neurons and post-neurons may be connected through a crossbar of RRAM device array, which naturally expresses a fully connected neural network.

For oxide RRAM device, a current conducting filament is formed within the switching layer of the device during an initial operation known as electroforming. Electroforming of oxide RRAM device is similar to dielectric break-down and it typically follows Poisson area scaling. In other words, the smaller the RRAM device size is, the higher the needed forming voltage becomes in the electroforming process. For example, the forming voltage of an oxide RRAM device at sub-um dimension is typically larger than 2V and this forming voltage increases as the dimension of the device further scales down. On the other hand, in state-of-the-art CMOS technologies, a single metal-oxide-semiconductor field-effect-transistor (MOSFET) may not be able to support such a large forming voltage for the purpose of electroforming the device. One compromise may thus be to supply such forming voltage by forming multiple MOSFETs that are stacked together, which nevertheless introduces significant penalty on device footprint.

SUMMARY

Embodiments of present invention provide a semiconductor structure that includes a resistive random-access memory (RRAM). The RRAM includes a bottom electrode, an oxide layer on top of the bottom electrode, and a top electrode on top of the oxide layer, wherein the oxide layer includes hydrogen; a first metal layer in a first interlevel-dielectric (ILD) layer and above the RRAM, the first metal layer being in contact with the top electrode of the RRAM through a via contact; and a capping layer directly on top of the first metal layer, wherein the capping layer is a layer of carbon-hydrogen containing silicon-nitride.

In one embodiment, the oxide layer is a layer of hafnium-oxide (HfO), tantalum-oxide (TaO), titanium-oxide (TiO) or a combination thereof.

In another embodiment, the oxide layer contains hydrogen, and the hydrogen in the oxide layer has a concentration level that is less than $10^{20}$ atoms/cm$^3$.

In one embodiment, the top electrode has a first size and the bottom electrode has a second size, and the first size is larger than the second size.

In another embodiment, the bottom electrode is embedded in a dielectric layer, the bottom electrode and the dielectric layer being directly on top of a second metal layer and the second metal layer being embedded in a second ILD layer.

In one embodiment, the top electrode and the oxide layer of the RRAM are encapsulated by an encapsulation layer, and the via contact is in direct contact with the top electrode through at least the encapsulation layer.

Embodiments of present invention also provide a method of forming a semiconductor structure that contains at least one resistive random-access memory. The method includes forming a dielectric layer on top of a supporting structure, wherein the dielectric layer has a bottom electrode embedded therein; forming an oxide layer on top of the bottom electrode; forming a top electrode on top of the oxide layer; forming a first interlevel-dielectric (ILD) layer on top of the top electrode; forming a via contact and a first metal layer in the first ILD layer, wherein the first metal layer is in contact with the top electrode through the via contact; forming a capping layer on top of the first metal layer through a plasma-enhanced chemical-vapor-deposition (PECVD) process; and causing formation of one or more filaments in the oxide layer during the PECVD process of forming the capping layer.

In one embodiment, the oxide layer is a layer of hafnium-oxide (HfO), tantalum-oxide (TaO), titanium-oxide (TiO), or a combination thereof.

According to one embodiment, the method further includes, before forming the top electrode, subjecting the oxide layer to a plasma environment that contains hydrogen, thereby causing the oxide layer to contain hydrogen with a concentration level that is less than $10^{20}$ atoms/cm$^3$ and to have oxygen vacancies.

In one embodiment, causing the formation of one or more filaments includes funneling free electrons to the oxide layer during the plasma-enhanced deposition process and using the oxygen vacancies as precursors to form the one or more filaments.

In another embodiment, the capping layer is a carbon-hydrogen containing silicon-nitride layer formed through the PECVD process.

In one embodiment, the capping layer is formed in the PECVD process in an environment that contains precursors of at least silicon, nitrogen, carbon, and hydrogen.

According to one embodiment, the method further includes forming an encapsulation layer to cover the oxide layer and the top electrode.

In one embodiment, the encapsulation layer is a conformal dielectric layer.

In another embodiment, the via contact is made through the encapsulation layer to be in direct contact with the top electrode.

BRIEF DESCRIPTION OF THE DRAWINGS

The present invention will be understood and appreciated more fully from the following detailed description of embodiments of present invention, taken in conjunction with accompanying drawings of which.

Figure 1:
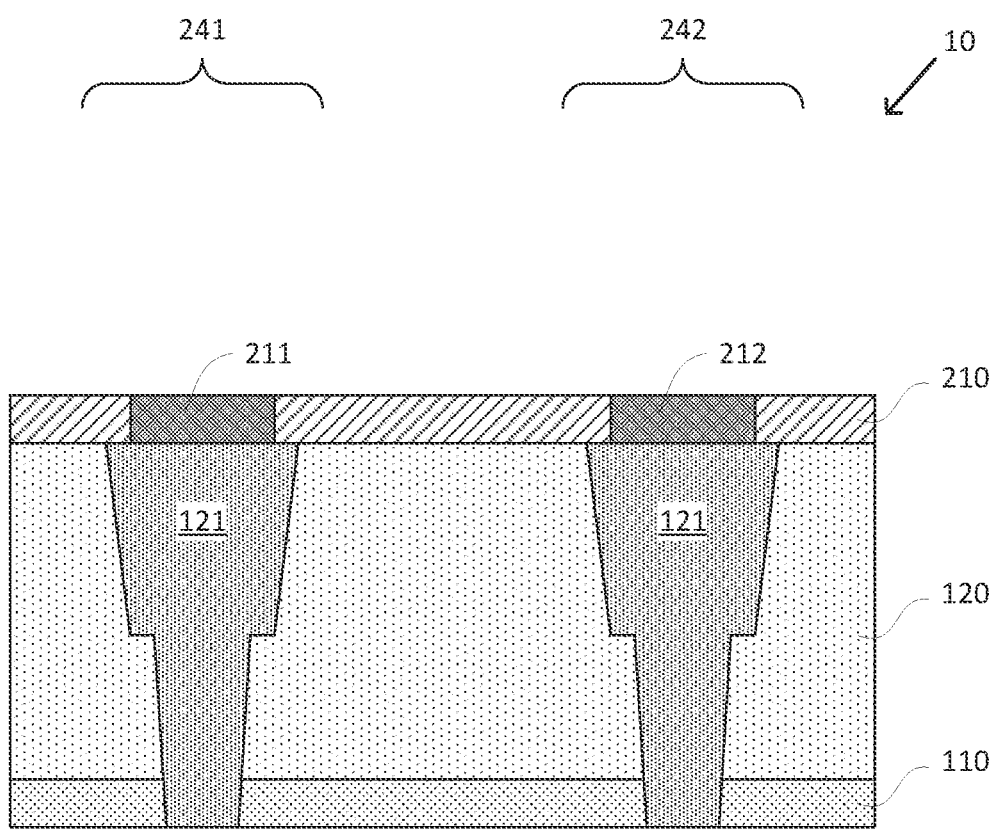
FIGS. 1-11 are demonstrative illustrations of cross-sectional views of a resistive random-access memory device in a series of steps of manufacturing thereof according to embodiments of present invention.

It will be appreciated that for simplicity and clarity purpose, elements shown in the drawings have not necessarily been drawn to scale. Further, and if applicable, in various functional block diagrams, two connected devices and/or elements may not necessarily be illustrated as being connected. In some other instances, grouping of certain elements in a functional block diagram may be solely for the purpose of description and may not necessarily imply that they are in a single physical entity, or they are embodied in a single physical entity.

DETAILED DESCRIPTION

In the below detailed description and the accompanying drawings, it is to be understood that various layers, structures, and regions shown in the drawings are both demonstrative and schematic illustrations thereof that are not drawn to scale. In addition, for the ease of explanation, one or more layers, structures, and regions of a type commonly used to form semiconductor devices or structures may not be explicitly shown in a given illustration or drawing. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present such as, by way of example only, 1% or less than the stated amount. Likewise, the terms "on", "over", or "on top of" that are used herein to describe a positional relationship between two layers or structures are intended to be broadly construed and should not be interpreted as precluding the presence of one or more intervening layers or structures.

To provide spatial context to different structural orientations of the semiconductor structures shown in the drawings, XYZ Cartesian coordinates may be provided in some of the drawings. The terms "vertical" or "vertical direction" or "vertical height" as used herein denote a Z-direction of the Cartesian coordinates shown in the drawings, and the terms "horizontal" or "horizontal direction" or "lateral direction" as used herein denote an X-direction and/or a Y-direction of the Cartesian coordinates shown in the drawings.

Moreover, although various reference numerals may be used across different drawings, the same or similar reference numbers are used throughout the drawings to denote the same or similar features, elements, or structures, and thus detailed explanations of the same or similar features, elements, or structures may not be repeated for each of the drawings for economy of description. Labelling for the same or similar elements in some drawings may be omitted as well in order not to overcrowd the drawings.

FIGS. 1-11 are demonstrative illustrations of cross-sectional views of a resistive random-access memory (RRAM) device 10 in a series of steps of manufacturing thereof according to embodiments of present invention. More particularly, as is illustrated in FIG. 1, embodiments of present invention provide receiving a supporting structure such as, for example, a back-end-of-line (BEOL) structure that includes a dielectric layer 120 with a metal layer 121 embedded therein. The metal layer 121 may be, for example, a M2 or M3 layer and may be a layer of copper (Cu), cobalt (Co), tungsten (W), aluminum (Al), ruthenium (Ru), or other conductive materials. The dielectric layer 120 may be on top of another dielectric layer 110.

Embodiments of present invention further provide forming one or more bottom electrodes on top of the metal layer 121. Here, for the purpose of description, a first bottom electrode 211 and a second bottom electrode 212 are demonstratively illustrated in FIG. 1. The first bottom electrode 211 and the second bottom electrode 212 are formed directly on top of the metal layer 121 for a first RRAM 241 and a second RRAM 242 respectively. However, embodiments of present invention are not limited in this aspect. For example, fewer or greater bottom electrodes may be formed in forming a corresponding fewer or greater number of RRAMs. The first and second bottom electrodes 211 and 212 may include, for example, titanium-nitride (TiN) or tantalum-nitride (TaN) and may be formed to be embedded in a dielectric layer 210. In one embodiment, the dielectric layer 210 may include, for example, silicon-nitride (SiN) or silicon-carbonitride (SiNC).

More specifically, in forming the first and second bottom electrodes 211 and 212, one embodiment of present invention may provide forming the dielectric layer 210 on top of the metal layer 121 and the dielectric layer 120. One or more openings may then be created in the dielectric layer 210, through a lithographic patterning and etching process, to expose the metal layer 121. Next, conductive materials such as TiN or TaN may be deposited through, for example, a chemical-vapor-deposition (CVD) process, a physical-vapor-deposition (PVD) process, or an atomic-layer-deposition (ALD) process in the openings to form the bottom electrodes 211 and 212. Following the deposition of the conductive material, a chemical-mechanic-polishing (CMP) process may be applied, for example, to planarize top surfaces of the bottom electrodes 211 and 212.

Figure 2:
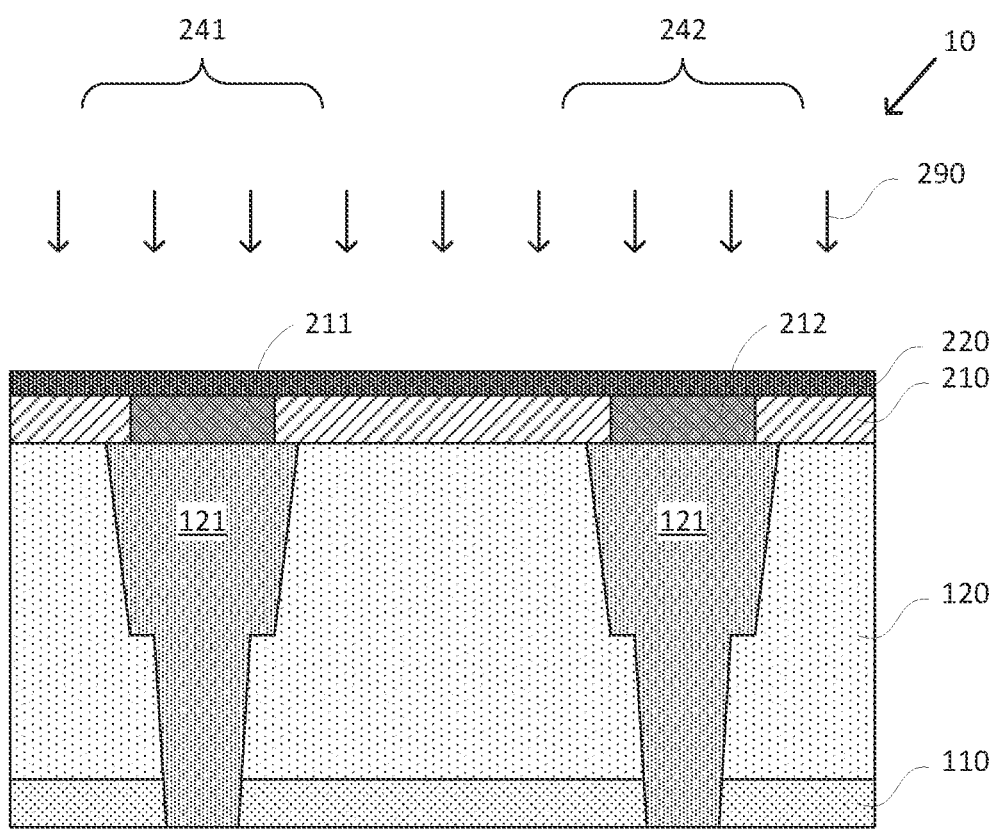

As is illustrated in FIG. 2, embodiments of present invention further provide forming a blanket oxide layer 220 on top of the bottom electrodes 211 and 212 and the dielectric layer 210. The blanket oxide layer 220 may be a layer of, for example, hafnium-oxide (HfOx), tantalum-oxide (TaOx), titanium-oxide (TiOx), or a combination thereof and may be formed to have a thickness ranging from about 3 nm to about 20 nm. Here, x represents an integer such as 1, 2, etc. For simplicity, sometimes hafnium-oxide, tantalum-oxide, and titanium-oxide may simply be represented by HfO, TaO, and TiO respectively. The formation of the blanket oxide layer 220 may be made through, for example, a deposition process such as, for example, a CVD, PVD, or ALD process, although other currently existing or future developed means or processes may be used as well.

Embodiments of present invention may further include subjecting the blanket oxide layer 220 to a hydrogen ($H_2$) based plasma treatment. This plasma treatment creates oxygen vacancies within the blanket oxide layer 220 that may serve as precursors for oxide breakdown during a downstream processing of forming filament according to embodiment of present invention. The hydrogen-based plasma treatment may also leave residual hydrogen atoms in the blanket oxide layer 220 after treatment. For example, the concentration level of hydrogen atoms in the blanket oxide layer 220, also known as hydrogen impurity, may be less than, for example, $10^{20}$ atoms/cm$^3$ and in one embodiment may be between $10^{18}$ atoms/cm$^3$ and $10^{20}$ atoms/cm$^3$ after the plasma treatment.

Figure 3:
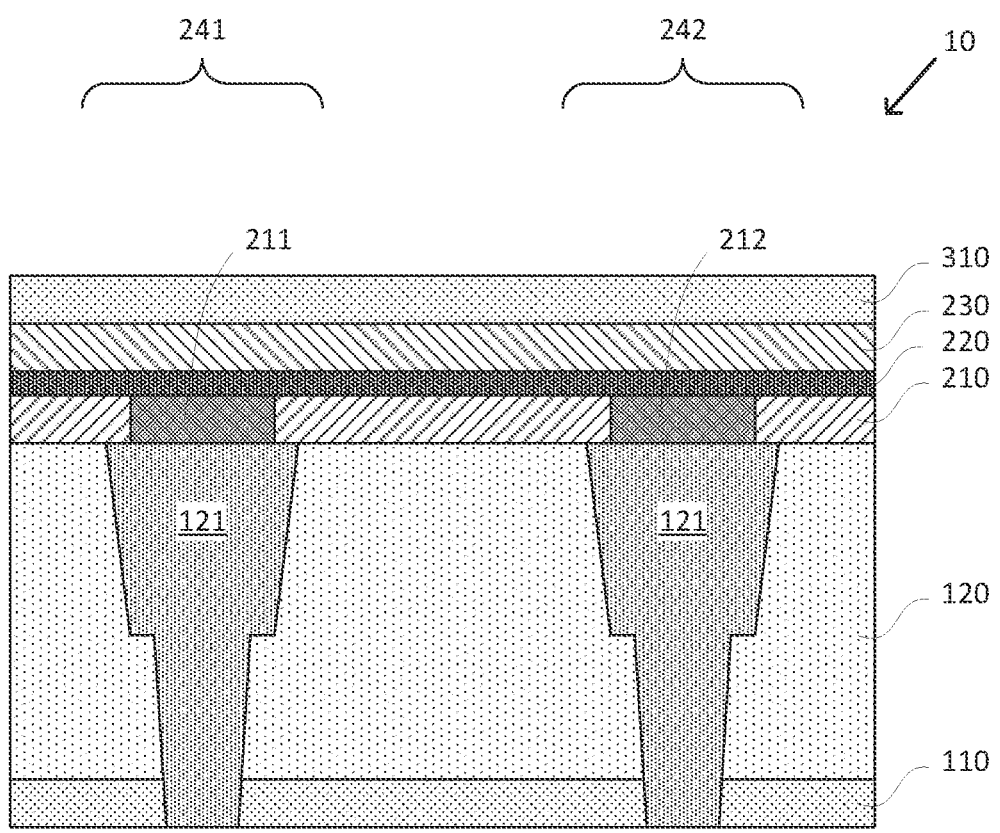

As is illustrated in FIG. 3, embodiments of present invention provide forming a top electrode layer 230 on top of the blanket oxide layer 220 and a hard mask layer 310 on top of the top electrode layer 230. More specifically, the top electrode layer 230 may be formed through a deposition process, such as a CVD, PVD or ALD process, to have a thickness ranging from about 10 nm to about 30 nm. The top electrode layer 230 may be made of or include TiN or TaN and in one embodiment may be made of a same material as the bottom electrodes 211 and 212. Following the formation of the top electrode layer 230, the hard mask layer 310 may be formed on top thereof. The hard mask layer 310 may be a layer of dielectric material such as SiN and may be formed to have a thickness ranging from about 20 nm to about 60 nm.

Figure 4:
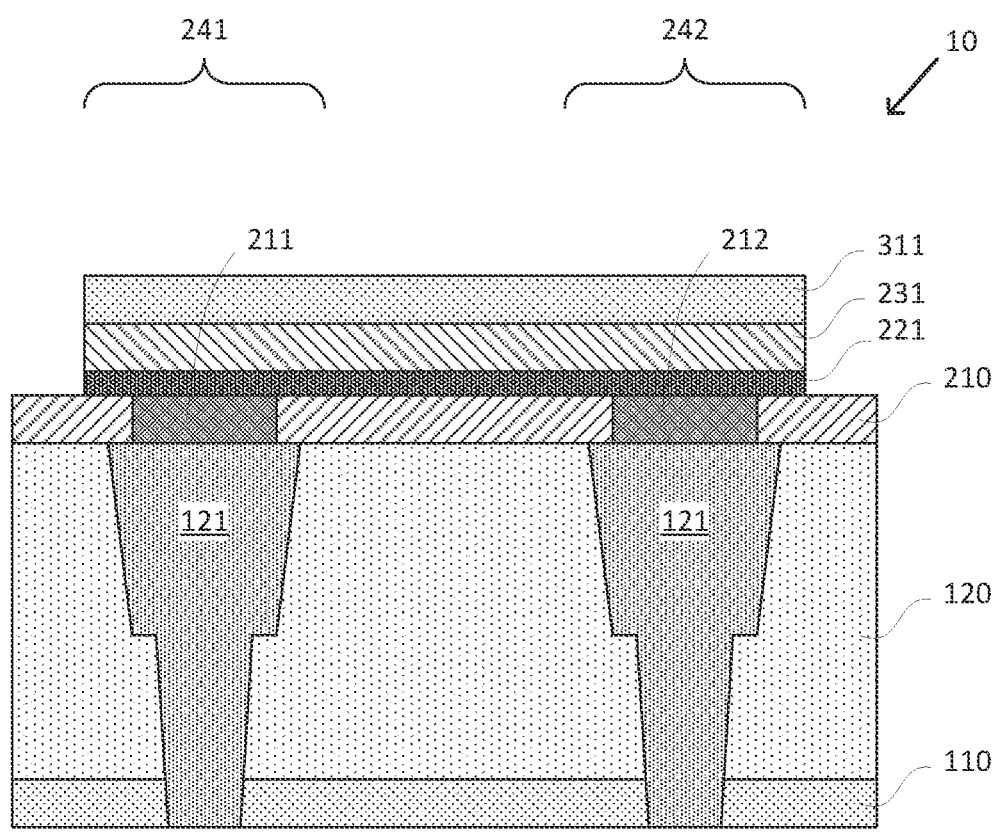

As is illustrated in FIG. 4, embodiments of present invention provide patterning the hard mask layer 310 into a hard mask 311 through, for example, a lithographic patterning process and a subsequent directional etching process such as a reactive-ion-etching (RIE) process. The formed hard mask 311 represents a pattern of a top electrode and an oxide layer underneath thereof. In the embodiment demonstratively illustrated in FIG. 4, the hard mask 311 represents a pattern of the top electrode and the oxide layer to be shared by the first RRAM 241 and the second RRAM 242. However, embodiments of present invention are not limited in this aspect. In one embodiment, the hard mask 311 may represent a pattern of a top electrode of only one RRAM. For example, the hard mask 311 may be formed to pattern a top electrode of the first RRAM 241 or alternatively of the second RRAM 242.

Embodiments of present invention further provide etching the top electrode layer 230 and the blanket oxide layer 220 into a top electrode 231 and an oxide layer 221, using the hard mask 311 in an anisotropic and/or directional etching process such as a RIE process. In the illustrated embodiment, the top electrode 231 and the oxide layer 221 underneath thereof cover both the first bottom electrode 211 of the first RRAM 241 and the second bottom electrode 212 of the second RRAM 242. In one embodiment, in a top view, the top electrode 231 and the oxide layer 221 may have a first size and the first bottom electrode 211 and/or the second bottom electrode 212 may have a second size. The first size may be larger than the second size.

Figure 5:
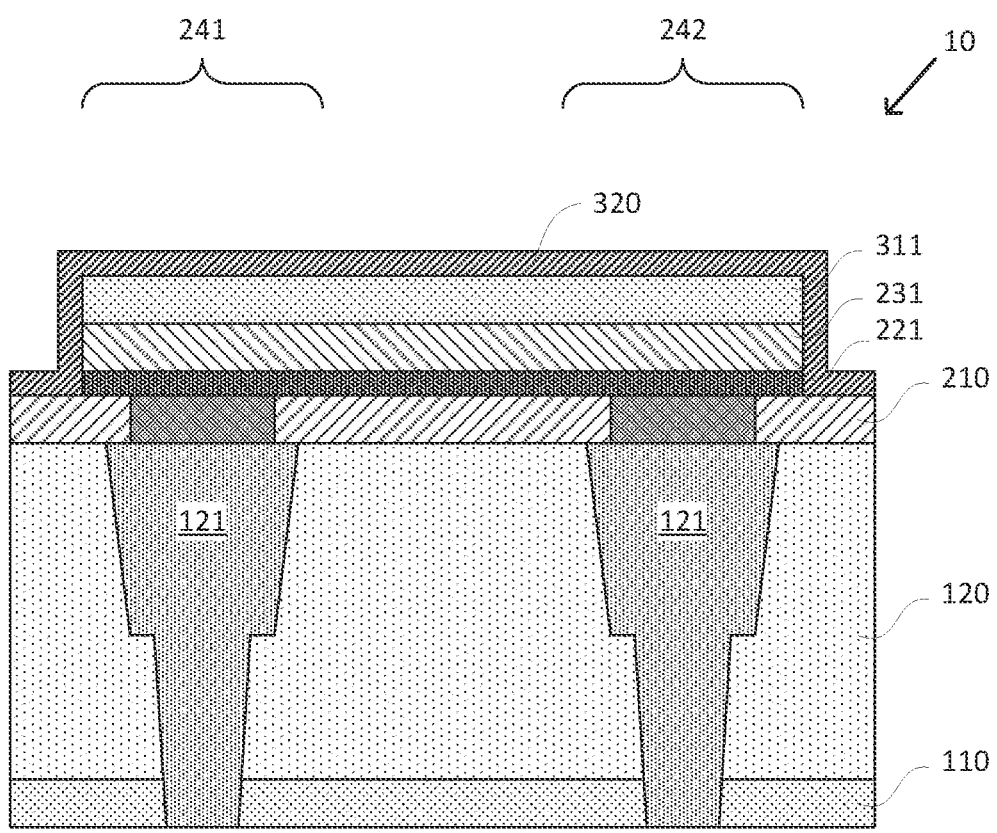

As is illustrated in FIG. 5, embodiments of present invention provide forming an encapsulation layer 320 covering the RRAM device 10. More specifically, the encapsulation layer 320 may cover a top surface of the hard mask 311, sidewall surfaces of the hard mask 311, the top electrode 231, the oxide layer 221, and a portion of the top surface of the dielectric layer 210 that is not covered by the oxide layer 221. In one embodiment, the encapsulation layer 320 may be a conformal dielectric layer or a conformal dielectric liner and may be deposited or formed to have a thickness ranging from about 5 nm to about 20 nm. The encapsulation layer 320 may include SiN, SiNC, or other suitable dielectric materials.

Figure 6:
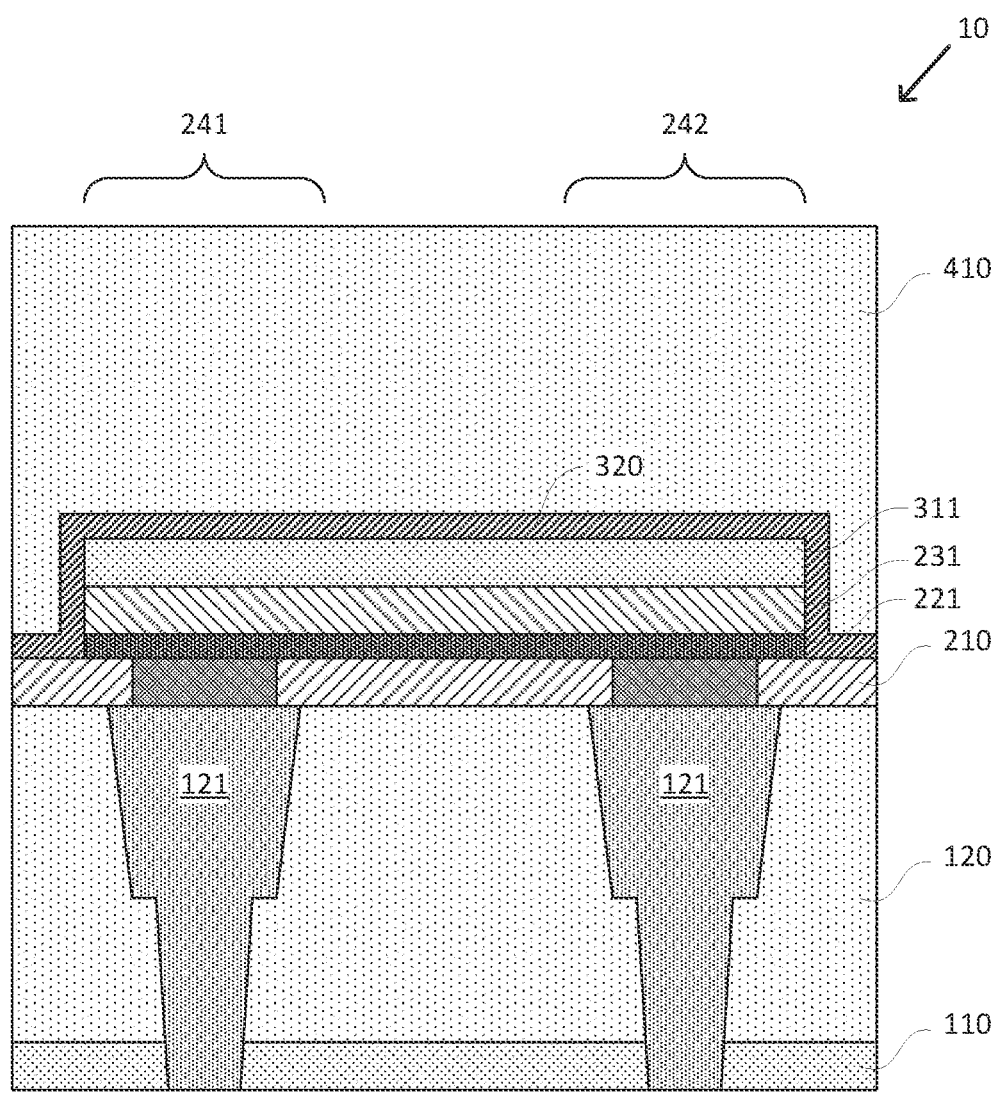

As is illustrated in FIG. 6, embodiments of present invention provide forming a first interlevel-dielectric (ILD) layer 410 covering the RRAM device 10. More specifically, the first ILD layer 410 may be a silicon-dioxide (SiO$_2$) layer, a porous SiO$_2$ layer, or other low-k dielectric material layer and may be formed through a deposition process, such as a CVD, PVD, or ALD process, directly on top of the encapsulation layer 320. The first ILD layer 410 may be formed to have a thickness ranging from about 300 nm to about 500 nm. A CMP process may be used to planarize the top surface of the first ILD layer 410.

Figure 7:
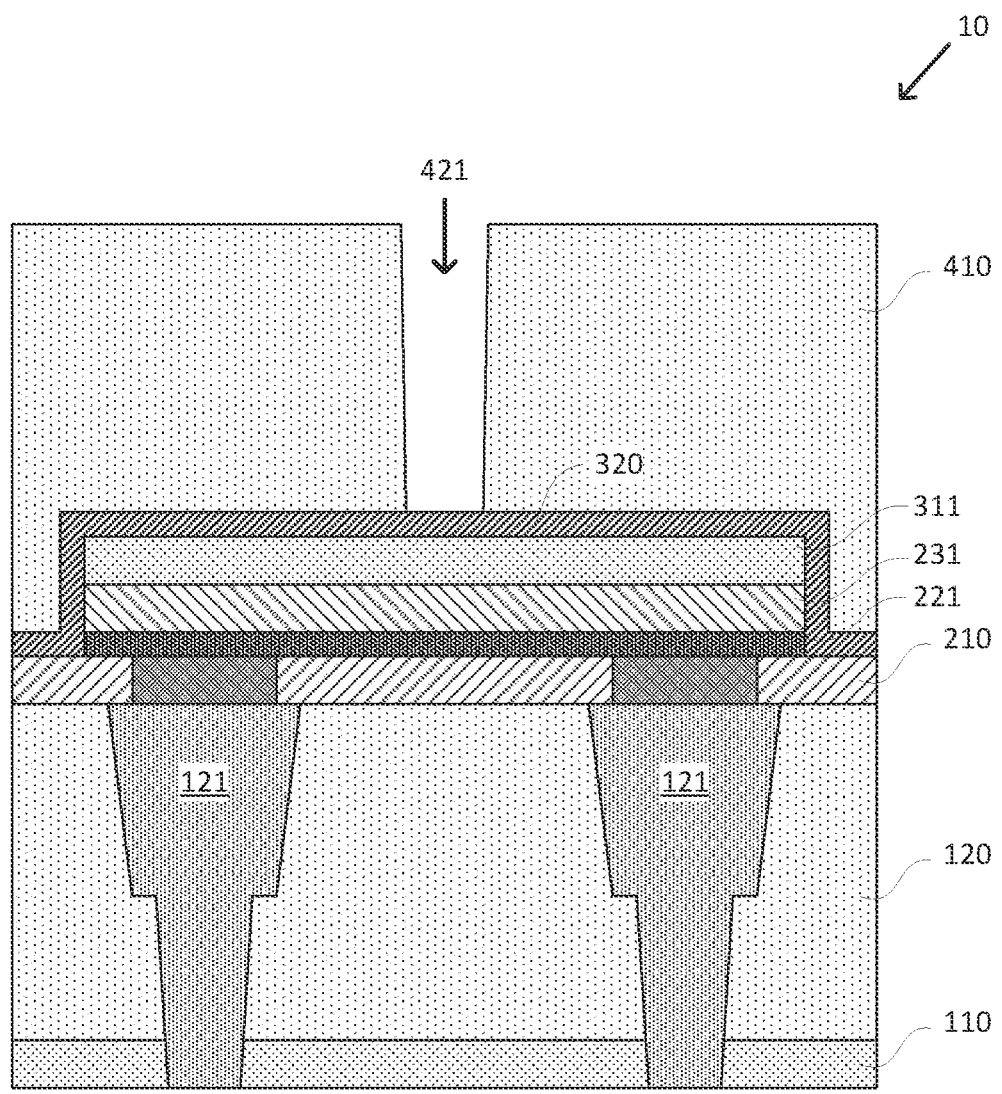

As is illustrated in FIG. 7, embodiments of present invention provide forming a via hole 421 in the first ILD layer 410 through a lithographic patterning and etching process. For example, an etch mask may first be formed to cover most of the first ILD layer 410 except a surface area where the via hole 421 is to be made. Subsequently, an anisotropic or directional etching process may be used to etch the portion of the first ILD layer 410 that is exposed by the etch mask resulting the via hole 421. This etching process may be a selective etching process and may stop at the encapsulation layer 320. The size of the via hole 421 may typically represent the size of a via contact, to be formed later, to contact the top electrode 231.

Figure 8:
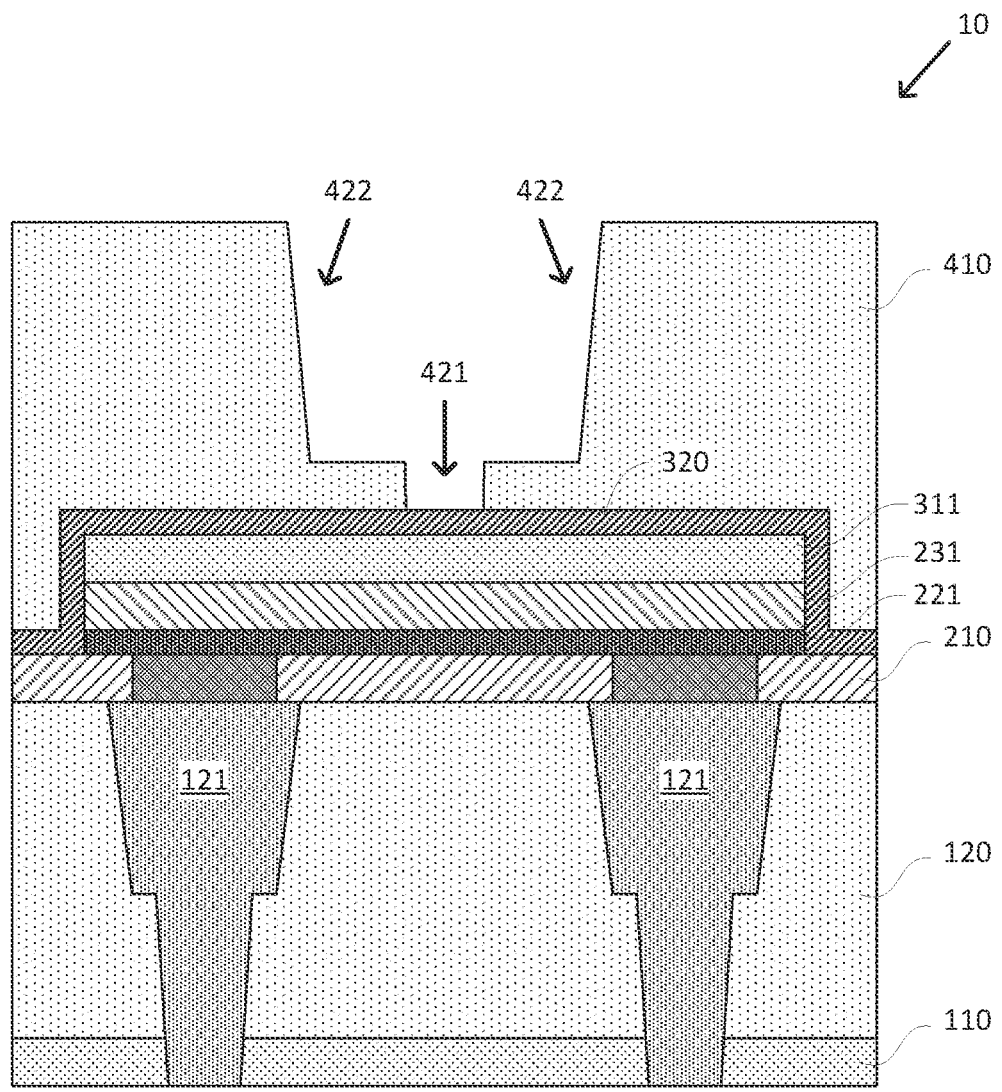

As is illustrated in FIG. 8, embodiments of present invention provide forming a trench opening 422 above the via hole 421 and to overlap with the via hole 421. The trench opening 422 may be formed for forming a metal layer, such as a M3 or M4 layer, in the first ILD layer 410, and thus may be formed to have a depth that is less than that of the via hole 421 and definitely less than a thickness of first ILD layer 410. The trench opening 422 may be formed or created through a lithographic patterning and etching process, similar to that of forming the via hole 421.

Figure 9:
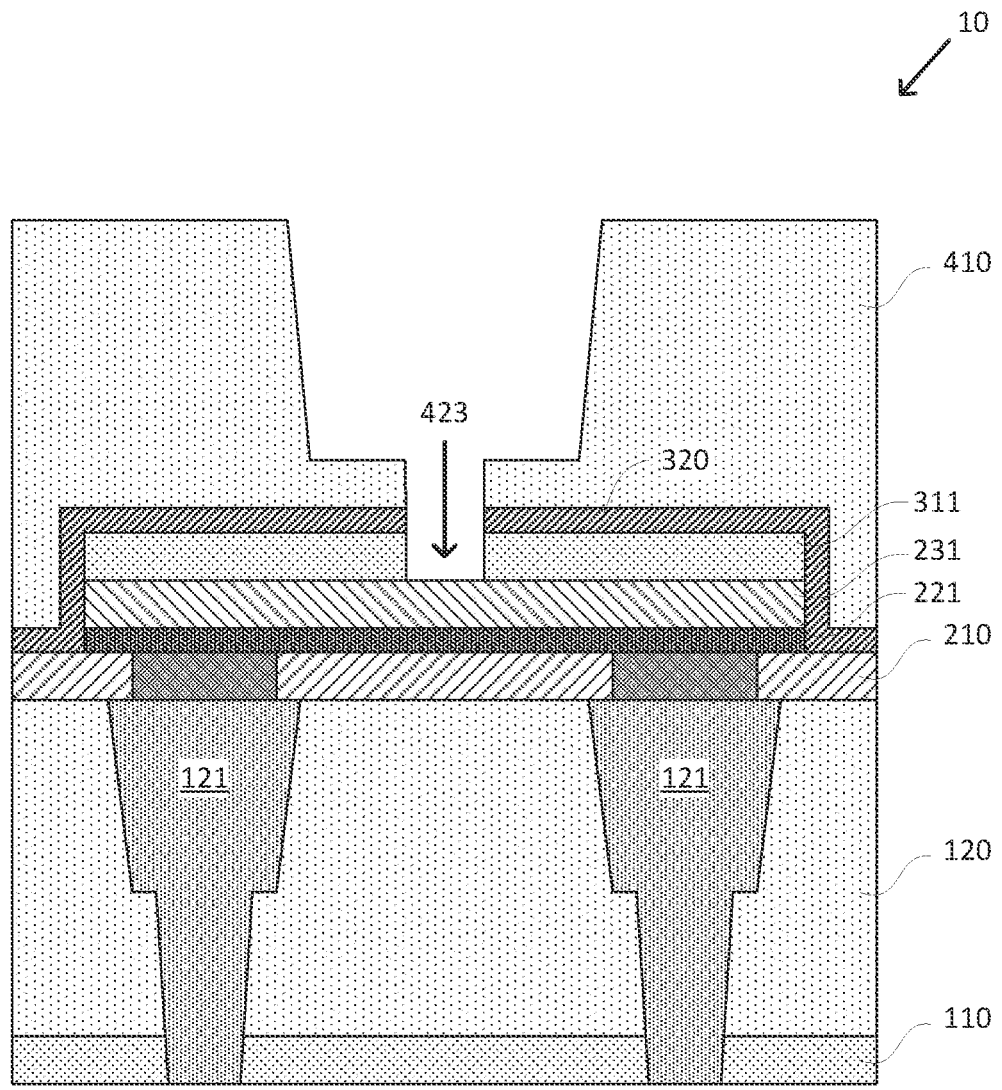

As is illustrated in FIG. 9, embodiments of present invention provide performing another selective etching process that selectively etches the encapsulation layer 320 and the hard mask 311 underneath thereof. In other words, this selective etching process may not substantially etch the first ILD layer 410. Instead, in this selective etching process, the first ILD layer 410 may be used as an etch mask and the pattern of the via hole 421 may be transferred to the encapsulation layer 320 and the hard mask 311. In other words, the etching process may create a modified via hole 423 that goes through the encapsulation layer 320 and the hard mask 311 and selectively stops at the top electrode 231, thereby exposing a top surface of the top electrode 231.

Figure 10:
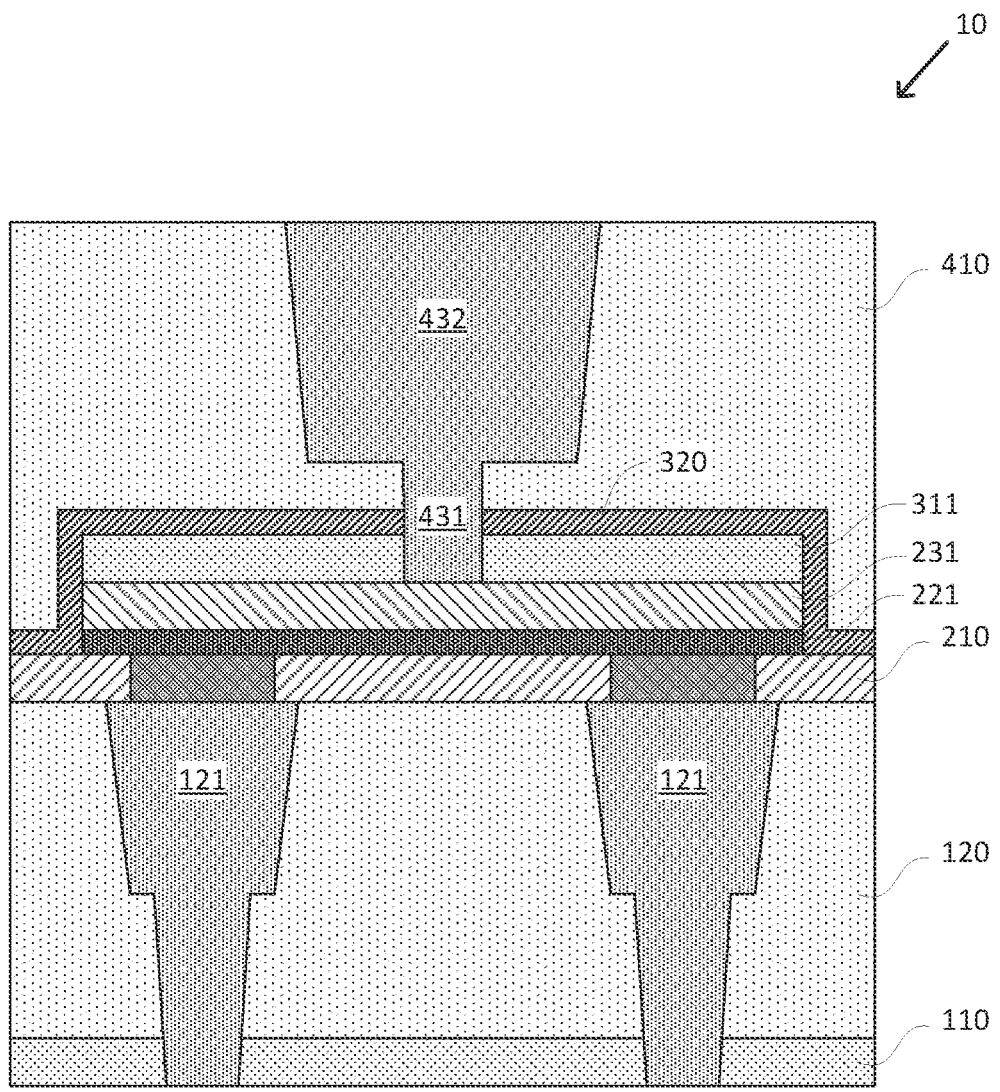

As is illustrated in FIG. 10, embodiments of present invention provide filling the modified via hole 423 with a conductive material, for example through a CVD, PVD, or ALD deposition process, to form a via contact 431 and filling the trench opening 422 above the modified via hole 423, with a same or different conductive material, to form a metal layer 432. In one embodiment, the conductive material may be copper (Cu), cobalt (Co), tungsten (W), aluminum (Al), ruthenium (Ru), or other conductive materials. After the deposition of the conductive material, a CMP process may be used to planarize a top surface of the metal layer 432. The metal layer 432 may be embedded in the first ILD layer 410 and may be in contact with the top electrode 231 through the via contact 431. In other words, the via contact 431 is in direct contact with the top electrode 231 through at least the encapsulation layer 320 and thus the metal layer 432 is conductively connected to the top electrode 231.

Figure 11:
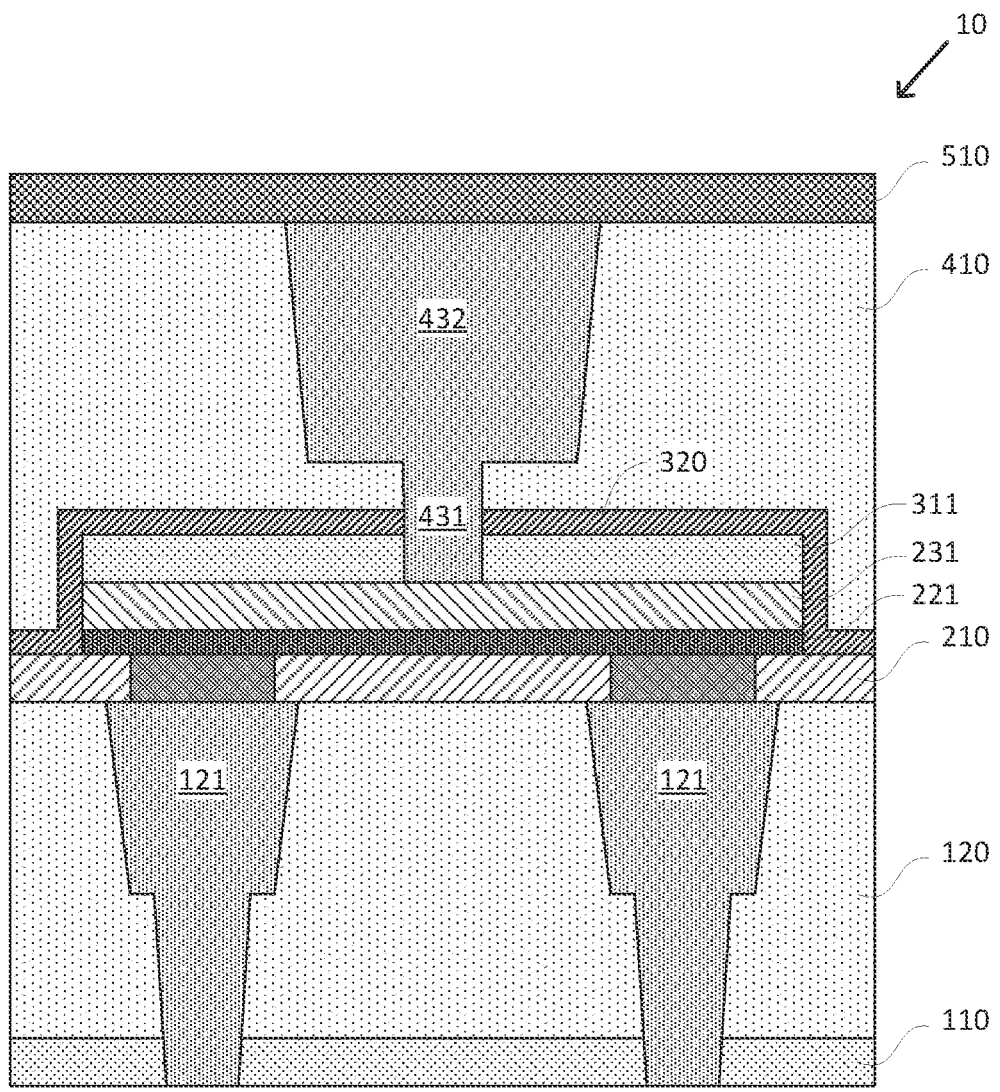

As is illustrated in FIG. 11, embodiments of present invention provide forming a capping layer 510 directly on top of the metal layer 432. The capping layer 510 may also be formed on top of the first ILD layer 410. In one embodiment, the capping layer 510 may be formed through a plasma-enhanced chemical-vapor-deposition (PECVD) process of depositing a silicon-nitride layer in an environment that contains carbon-hydrogen. As a result, the capping layer 510 formed thereby may be a carbon-hydrogen containing silicon-nitride. In one embodiment, the capping layer 510 may be a layer of NBLoK film, which may be a material represented by $SiC_xN_yH_z$ where x, y, z are integers such as 1, 2, etc. For simplicity, the NBLok film may be represented sometimes simply as SiCNH.

During the PECVD process, free electrons in the plasma ambient environment may bombard the surface of the metal layer 432. Since the total surface area of the metal layer 432 is generally significantly larger than that of the first RRAM 241 and/or the second RRAM 242, the metal layer 432 serves as an antenna that collects the free electrons from the plasma ambient and subsequently funnels them to the first RRAM 241 and/or the second RRAM 242 of the RRAM device 10. At one point, the density of the free electrons may become sufficiently high to cause electro-forming when they reach the area of the RRAM device.

This electro-forming process generally only happens during the initial stage of the deposition step of the capping layer 510 by virtue of the self-limiting mechanism or effect of the capping layer 510 formed on top of the device. More particularly, the deposited capping layer 510 blocks excessive plasma bombardment, thereby avoiding formation of excessive filament that facilitates controlled filament formation.

Figure 12:
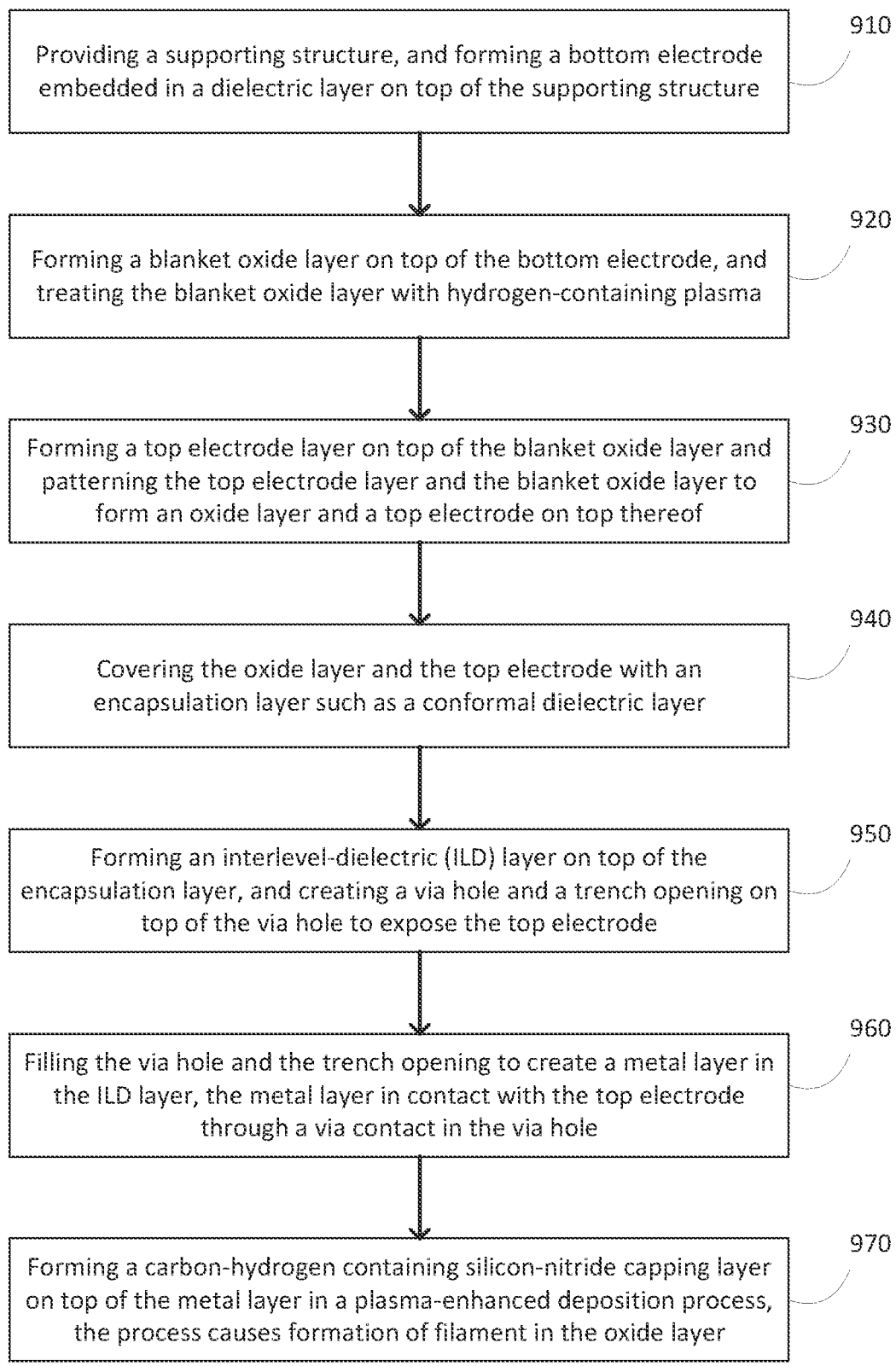
FIG. 12 is a demonstrative illustration of a flow-chart of a method of manufacturing a resistive random-access memory device according to embodiments of present invention.

FIG. 12 is a demonstrative illustration of a flow-chart of a method of manufacturing a RRAM device according to embodiments of present invention. The method includes (910) providing a supporting structure, and forming a bottom electrode embedded in a dielectric layer are on top of the supporting structure; (920) forming a blanket oxide layer on top of the bottom electrode, and treating the blanket oxide layer with a hydrogen-containing plasma; (930) forming a top electrode layer on top of the blanket oxide layer and patterning the top electrode and the blanket oxide layer to form an oxide layer and a top electrode on top thereof; (940) covering the oxide layer and the top electrode with an encapsulation layer such as a conformal dielectric layer; (950) forming an interlevel-dielectric (ILD) layer on top of the RRAM device and particularly on top of the encapsulation layer, and creating a via hole and a trench opening on top of and overlapping with the via hole, thereby exposing the top electrode; (960) filling the via hole and the trench opening to create a metal layer in the ILD layer, the metal layer being in contact with the top electric through a via contact formed in the via hole; and (970) forming a carbon-hydrogen containing silicon-nitride capping layer on top of the metal layer in a plasma-enhanced CVD process, wherein the plasma-enhanced CVD process enables the formation of filament in the oxide layer of the RRAM device.

It is to be understood that the exemplary methods discussed herein may be readily incorporated with other semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Accordingly, at least portions of one or more of the semiconductor structures described herein may be implemented in integrated circuits. The resulting integrated circuit chips may be distributed by the fabricator in raw wafer form (that is, as a single wafer that has multiple unpackaged chips), as a bare die, or in a packaged form. In the latter case the chip may be mounted in a single chip package (such as a plastic carrier, with leads that are affixed to a motherboard or other high-level carrier) or in a multichip package (such as a ceramic carrier that has surface interconnections and/or buried interconnections). In any case the chip may then be integrated with other chips, discrete circuit elements, and/or other signal processing devices as part of either an intermediate product, such as a motherboard, or an end product. The end product may be any product that includes integrated circuit chips, ranging from toys and other low-end applications to advanced computer products having a display, a keyboard or other input device, and a central processor.

The descriptions of various embodiments of present invention have been presented for the purposes of illustration and they are not intended to be exhaustive and present invention are not limited to the embodiments disclosed. The terminology used herein was chosen to best explain the principles of the embodiments, practical application or technical improvement over technologies found in the marketplace, and to enable others of ordinary skill in the art to understand the embodiments disclosed herein. Many modifications, substitutions, changes, and equivalents will now occur to those of ordinary skill in the art. Such changes, modification, and/or alternative embodiments may be made without departing from the spirit of present invention and are hereby all contemplated and considered within the scope of present invention. It is, therefore, to be understood that the appended claims are intended to cover all such modifications and changes as fall within the spirit of the invention.

What is claimed is:

1. A method of forming a semiconductor structure, the method comprising:
    forming a dielectric layer on top of a supporting structure, wherein the dielectric layer has a bottom electrode embedded therein;
    forming an oxide layer on top of the bottom electrode;
    forming a top electrode on top of the oxide layer;
    forming an encapsulation layer to cover the oxide layer and the top electrode;
    forming a first interlevel-dielectric (ILD) layer on top of the top electrode;
    forming a via contact and a first metal layer in the first ILD layer, wherein the first metal layer is in contact with the top electrode through the via contact;
    forming a capping layer on top of the first metal layer; and
    causing formation of one or more filaments in the oxide layer.

2. The method of claim 1, wherein the oxide layer is a layer of hafnium-oxide (HfO), tantalum-oxide (TaO), titanium-oxide (TiO), or a combination thereof; the capping layer is formed through a plasma-enhanced-chemical-vapor-deposition (PECVD) process; and the one or more filaments are formed during the PECVD process.

3. The method of claim 2, further comprising, before forming the top electrode, subjecting the oxide layer to a plasma environment that contains hydrogen, thereby causing the oxide layer to contain hydrogen with a concentration level that is less than $10^{20}$ atoms/cm$^3$ and to have oxygen vacancies.

4. The method of claim 3, wherein causing the formation of one or more filaments in the oxide layer comprises funneling free electrons to the oxide layer during the PECVD process and using the oxygen vacancies as precursors in forming the one or more filaments.

5. The method of claim 1, wherein the capping layer is a layer of carbon-hydrogen containing silicon-nitride that is formed through a plasma-enhanced-chemical-vapor-deposition process.

6. The method of claim 1, wherein the capping layer is formed in a plasma-enhanced-chemical-vapor-deposition process in an environment that contains precursors of at least silicon, nitrogen, carbon, and hydrogen.

7. The method of claim 1, wherein the encapsulation layer is a conformal dielectric layer.

8. The method of claim 1, wherein the via contact is made through the encapsulation layer to be in direct contact with the top electrode.

* * * * *